United States Patent [19]
Yu et al.

[11] Patent Number: 5,753,548
[45] Date of Patent: May 19, 1998

[54] METHOD FOR PREVENTING FLUORINE OUTGASSING-INDUCED INTERLEVEL DIELECTRIC DELAMINATION ON P-CHANNEL FETS

[75] Inventors: Shau-Tsung Yu, Taipei; An-Min Chiang, Hsin-Chu; Yeh-Jye Wann, Hsin-Chiu; Pei-Hung Chen, Hsin-Chu, all of Taiwan

[73] Assignee: Taiwan Semiconductor Manufacturing Company, Ltd., Hsin-chu, Taiwan

[21] Appl. No.: 719,234

[22] Filed: Sep. 24, 1996

[51] Int. Cl.⁶ .................................. H01L 21/8238
[52] U.S. Cl. .................................. 438/231; 438/552
[58] Field of Search .................................. 438/230, 231, 438/232, 551, 552, 948, 949, 950

[56] References Cited

U.S. PATENT DOCUMENTS

| | | | |
|---|---|---|---|
| 5,405,791 | 4/1995 | Ahmad et al. | 438/231 |
| 5,439,834 | 8/1995 | Chen | 438/231 |

OTHER PUBLICATIONS

S. Wolf, "Silicon Processing In The VLSI ERA vol. 2" Lattice Press, Sunset Beach, CA, p. 398, (1990).

Primary Examiner—Chandra Chaudhari
Attorney, Agent, or Firm—George O. Saile; Stephen B. Ackerman

[57] ABSTRACT

A method is described for forming P-channel field effect transistors having shallow source/drain junctions and improved reliability for CMOS circuits. The method involves forming both N-channel and P-channel FETs by alternate photoresist masking and ion implantation. The shallow junction self-aligned source/drain areas for P-channel FETs are formed by implanting boron difluoride ($BF_2$) ions. In more conventional processing, the $BF_2$ ions implanted in the P-channel FET gate electrodes during the source/drain implant results in outgassing of fluorine from the gate electrodes after the interlevel dielectric (ILD) layer is deposited. This can result in void formation, or delamination, at the interface between the gate electrode and the ILD. The current invention provides an improved process which uses a photoresist block-out mask to eliminate the implantation of the $BF_2^+$ ions in the P-channel FET gate electrodes during the formation of the self-aligned $P^+$ source/drain regions. This prevents voids from forming at the gate electrode/ILD interface after the ILD layer is deposited and subsequent high-temperature processing steps are performed. The invention also reduces the enhanced boron diffusion in the P-FET gate oxide that can degrade the threshold voltage.

20 Claims, 2 Drawing Sheets

METHOD FOR PREVENTING FLUORINE OUTGASSING-INDUCED INTERLEVEL DIELECTRIC DELAMINATION ON P-CHANNEL FETS

Related Patent Application.

Ser. No. 08/714,734 filed Sep. 16, 1996 entitled A METHOD FOR PREVENTING DELAMINATION OF INTERLEVEL DIELECTRIC LAYER OVER FET P+ DOPED POLYSILICON GATE ELECTRODES ON SEMICONDUCTOR INTEGRATED CIRCUITS

BACKGROUND OF THE INVENTION

(1) Field of the Invention

The present invention relates to the fabrication of integrated circuit devices on semiconductor substrates, and more particularly relates to a method for making shallow source/drain junctions for P-channel field effect transistors (FETs) using boron difluoride ($BF_2^+$) ion implantation, while masking the $BF_2^+$ ions over the P-channel gate electrodes. This eliminates fluorine outgassing that would otherwise cause delamination of the overlying interlevel dielectric (ILD) layer.

(2) Description of the Prior Art

As the field effect transistors (FETs) decrease in size and the packing density (circuit density) and performance improve on integrated circuit chips, the power consumed by the individual transistors dramatically increases. It is necessary to find ways to reduce the power consumption. One important method is to form the logic-gates or inverter using Complementary Metal Oxide Silicon (CMOS) circuits. These CMOS circuits are formed from both N-channel and P-channel FETs, and are desirable because of the low power consumption. Typically in a single N-channel inverter, a relatively high steady current is present in the standby mode. As the number of FETs increases on the chip, the high power consumption becomes unacceptable. In the CMOS circuit (inverter) only one of the two transistors is on at any time, and virtually no current flows because of the high-impedance, and virtually no dc power is dissipated in the standby mode. This means that very high density ultra-large scale integrated (ULSI) circuits can be made without requiring expensive packaging for cooling.

The conventional CMOS circuits are formed in and on single crystalline semiconductor substrates (silicon) by fabricating the N-channel FETs in P-wells in the silicon substrate, and P-channel FETs in N-wells also formed in and on the substrate. However, as the channel lengths become smaller (e.g., less than 0.5 micrometers), short channel effects can adversely affect the FET electrical characteristics. For example, threshold voltage ($V_{th}$) shifts and drain-to-source punchthrough can occur. One method to reduce these effects is to reduce the source/drain junction depth. Typically, the shallow $N^+$ source/drains for the N-channel FETs are formed by implanting the relatively heavy ions arsenic ($As^{75}$) and pose no problem because of the small projected ion range in the silicon. However, for the $P^+$ source/drain (P-channel FETs), the implants for the relatively low mass boron ($B^{11}$) have a larger projected implant range, and the problem is further complicated by the high diffusivity of boron. The boron also has a longer implant tail due to channeling of the lower-mass boron ions along the crystalline planes during implantation. One common method of overcoming this deep junction for $P^+$ source/drains is to implant a heavier ion that also contains boron, such as $BF_2$ (mass number 49). Unfortunately, several problems arise due the presence of the fluorine. Since the source/drains of the FET are self-aligned to the polysilicon FET gate electrode using the polysilicon gate electrode to mask the implant over the channel regions, the $BF_2$ is also implanted into the polysilicon gate electrode. One problem that occurs is the enhanced diffusion of the boron in the gate oxide during the post-implant anneal above about 800° C. when $BF_2$ is used as the implant ion. This problem is described, for example, in Silicon Processing for the VLSI Era, Vol. 2, by S. Wolf, published by Lattice Press, Sunset Beach, Calif., 1990, pp. 398. Another serious problem that also occurs at relatively high post-implant processing temperatures is the outgassing of the fluorine atoms after an interlevel dielectric (ILD) layer is deposited over the gate electrodes to electrically insulate the devices. This problem is best understood by referring to the cross-sectional view of a completed P-channel FET depicted in FIG. 1. The P-FET is formed on and in an N-well region on a silicon substrate 10. Shown is the gate oxide 18 on which is patterned a $P^+$ doped polysilicon layer 20($P^+$) having sidewall spacers 26. The shallow, lightly doped source/drain regions 24 and the heavily doped source/drain contact regions 32 are formed by implanting $BF_2$ ions and are self-aligned to the gate electrode 20($P^+$). The gate electrode 20 ($P^+$), which acts as a block-out mask for self-aligning the source/drain implant to the gate electrode, is therefore also heavily doped with $BF_2$. When the ILD layer composed of the silicon nitride layer 34 and the BPSG layer 36 are deposited and high temperature processing is carried out, the fluorine atoms, depicted by the arrows 5, outgas from the surface of the gate electrode 20($P^+$) resulting in void formation or delamination at the $P^+$ doped polysilicon/ILD interface, thereby causing reliability problems. The $BF_2$ atoms also enhance the boron diffusion through the gate oxide, as previously mentioned, which can adversely affect the gate threshold voltage ($V_{th}$).

Therefore, there is a strong need in the semiconductor industry to provide a more reliable process for fabricating P-channel FETs using $BF_2^+$ implantation to make shallow source/drain contacts without the void formation or enhanced diffusion of boron through the gate oxide.

SUMMARY OF THE INVENTION

It is therefore a principal object of this invention to provide P-channel field effect transistors (FETs) having $P^+$ shallow source/drain contacts using $BF_2$ implantation.

It is another object of this invention to provide reliable P-channel FETs by preventing the source/drain contact $BF_2^+$ ion implant in the polysilicon gate electrode, thereby preventing the formation of voids at the interface between the polysilicon gate electrodes and overlying insulating layer, and further minimizing the enhanced diffusion of boron in the gate oxide.

It is still another object of this invention to provide a method for making N-channel and P-channel FETs on the same substrate for fabricating CMOS circuits.

The method for making CMOS structures with P-channel FETs having shallow source/drain regions formed by implanting boron difluoride ($BF_2$) ions begins by providing a single crystal silicon substrate. N-wells and P-wells are formed in the device areas for making P-channel and N-channel FETs, respectively. Field OXide (FOX) regions are formed on the surface of the substrate surrounding and electrically isolating the N- and P-well device areas. A gate oxide for the FETs is formed on the surface of the N-and P-wells. An undoped polysilicon layer is deposited on the substrate. The polysilicon layer over the N-wells is doped $P^+$ while the regions over the P-wells are masked with photoresist. After stripping the photoresist, the P-wells are doped with an $N^+$ dopant while masking the P-wells with photoresist. The doped polysilicon layer is then patterned to form gate electrodes for the N-channel and the P-channel FETs. The patterned polysilicon layer can also serve as local interconnections over the FOX regions, such as on static random access memory (SRAM) circuits, logic circuits, and the like. Lightly doped drains (LDDs) are now formed in the device areas adjacent to the gate electrodes, while using a photoresist implant mask to mask areas where implants are not desired. $N^-$LDDs are formed in the P-well regions and $P^-$LDDs are formed in the N-well regions.

Sidewall spacers are formed next on the sidewalls of the gate electrodes by depositing a conformal first insulating layer and anisotropically etching back the first insulating layer. The source/drain regions are formed next. The heavily doped source/drain for the N-channel FETs are formed by implanting an N-type dopant, such as arsenic, in the P-well regions adjacent to the sidewall spacers, while masking from implant the N-well regions by using a photoresist mask. The source/drain regions for the P-channel FETs are formed by implanting a $P^+$ dopant, and more specifically by implanting boron difluoride ($BF_2$) while masking the P-well regions with a photoresist mask. More specific to this invention, the implant block-out mask is modified or redesigned to provide portions over the P-channel FET gate electrodes so as to block out the $BF_2^+$ ion implant from the P-channel FET gate electrodes formed on the N-wells. This prevents the gate electrodes from being heavily doped with $BF_2$. As discussed in the prior art, voids or delamination will occur if the gate electrode is heavily doped with $BF_2$ during subsequent high-temperature processing. Because the gate electrode is not heavily doped with $BF_2$, the void or delamination problem does not occur. Furthermore, the enhanced diffusion of boron in the FET gate oxide, which results from the presence of fluorine, is essentially eliminated.

After removing the photoresist, a second insulating layer composed of silicon nitride ($Si_3N_4$) is blanket deposited over the substrate and protects the FETs from ionic contamination, such as sodium ions. A third insulating layer composed of borophosphosilicate glass (BPSG) is deposited on the second insulating layer, and is levelled by thermal anneal to form essentially a locally planar surface. This completes the fabrication of the N-and P-channel FETs used for making CMOS circuits in which the patterned $P^+$ doped polysilicon layer (P-channel gate electrodes) and the ILD layer are free of voids at the interface.

BRIEF DESCRIPTION OF THE DRAWINGS

The object and other advantages of this invention are best understood by the following embodiment with reference to the attached drawings which are now briefly described.

DESCRIPTION OF THE PREFERRED EMBODIMENTS

Figure 3:
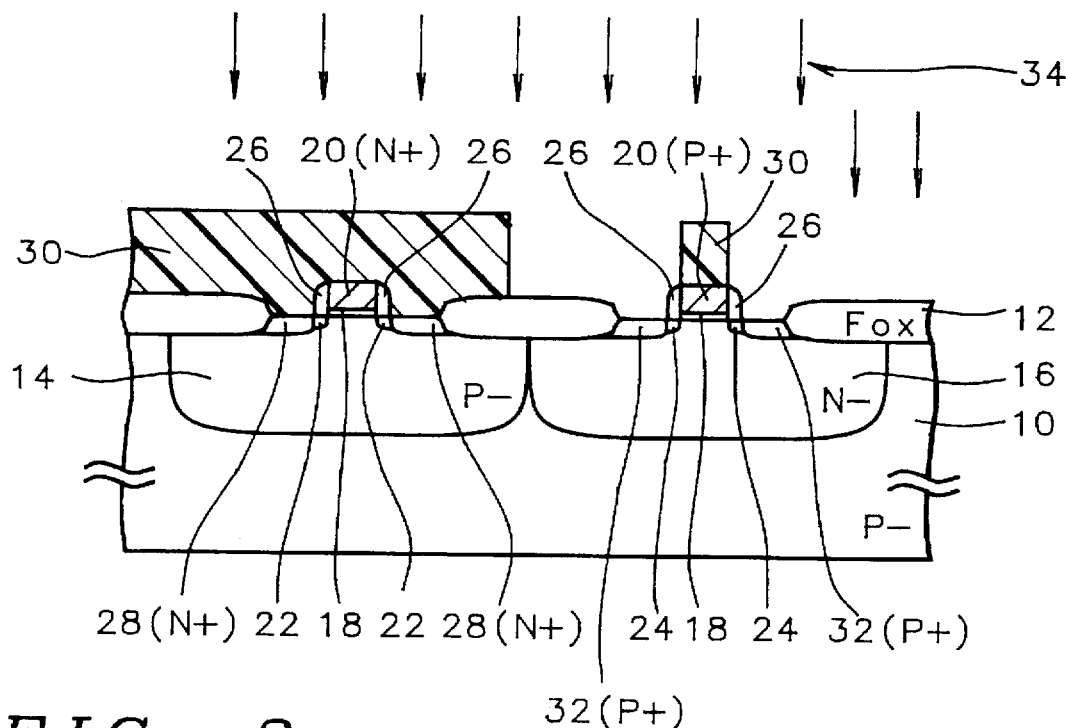
Figure 4:
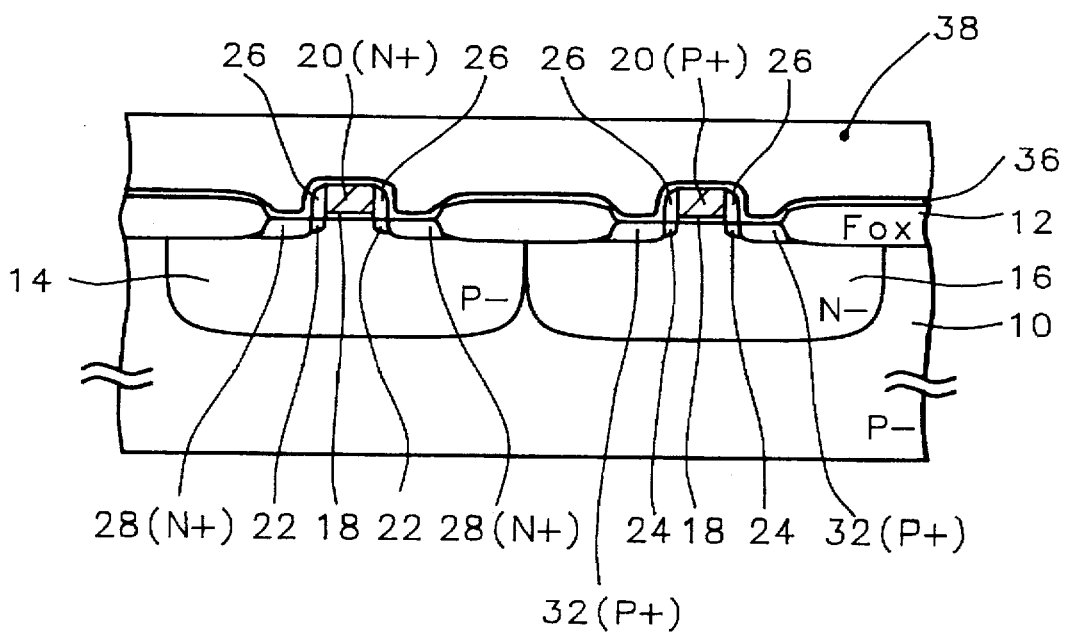

Now in keeping with the objects of this invention, the method for forming a CMOS structure having an improved P-channel FET is covered in detail. The method involves using $BF_2$ ion implantation to fabricate shallow source/drain junctions, while avoiding the delamination between the $P^+$ doped polysilicon layer and the overlying ILD layer. The sequence of fabrication steps is shown in FIGS. 2 through 4.

It should also be well understood by one skilled in the art that although the invention is described for eliminating the voids formed on P-channel FETs for the purpose of making reliable CMOS circuits, the method for eliminating voids equally applies to other devices and areas on the substrate where boron difluoride ($BF_2$) is implanted in the polysilicon layer.

Figure 1:
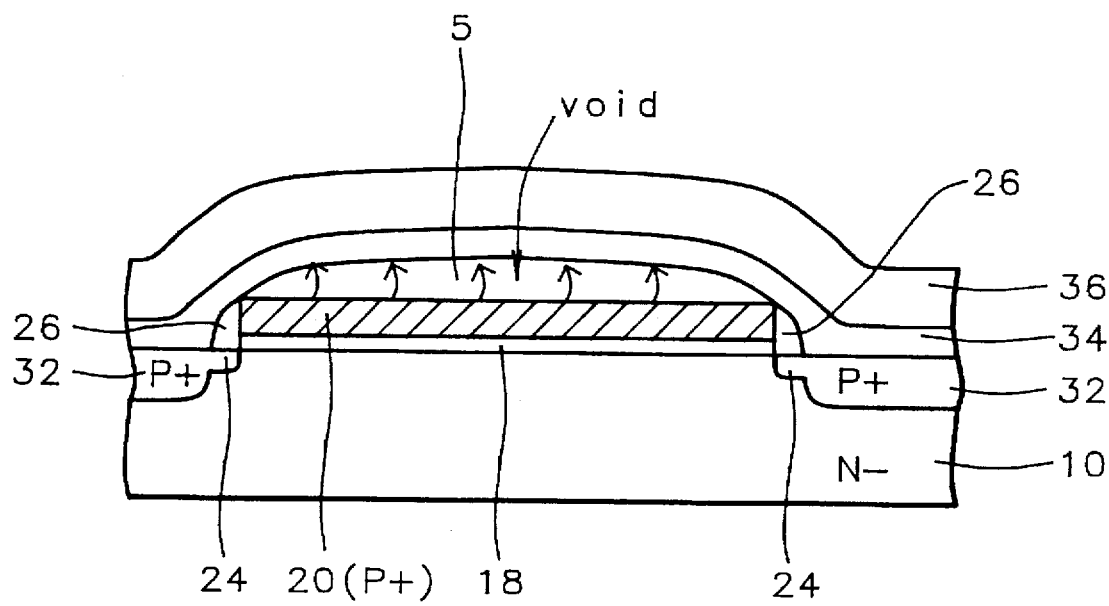
FIG. 1 shows a schematic cross-sectional view of a P-channel FET depicting the problem of void formation or delamination between a P-doped polysilicon gate and the overlying interlevel dielectric (ILD) layer.
Figure 2:
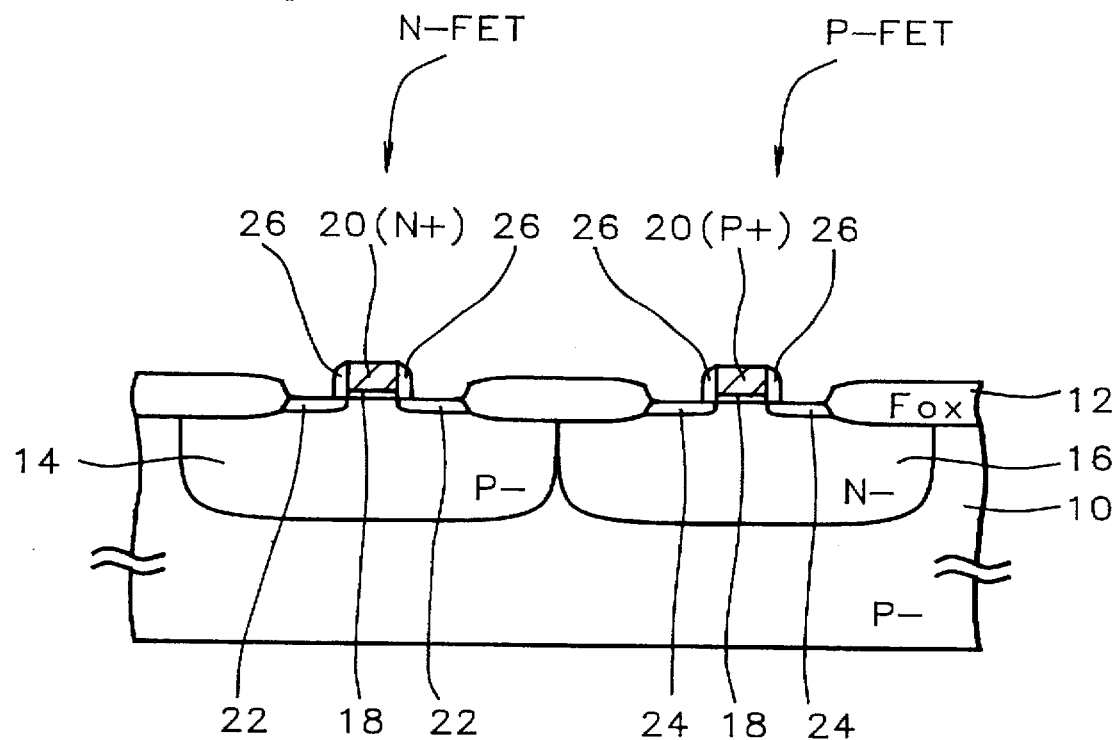
FIGS. 2 through 4 show schematic cross-sectional views depicting the sequence of processing steps for forming a P- and N-channel FET used in the fabrication of CMOS circuits in which the P-channel FET fabricated by this invention is free of voids between the gate electrodes and the overlying ILD layer.

Referring now to FIG. 2, a cross-sectional view of the substrate 10 having a partially completed N-channel and P-channel FET is shown. The preferred substrate is composed of a P-type single crystalline silicon having a <100> crystallographic orientation. P-wells 14 and N-wells 16 are now formed in the substrate 10, as shown in FIG. 2, by ion implanting a P-type dopant, such as boron ($B^{11}$), in the P-well regions 14, and an N-type dopant, such as arsenic ($As^{75}$), in the N-well regions 16. Conventional photolithographic techniques are used to form implant block-out masks to prevent implanting the P-dopant in the N-well regions 16 and the N-dopant in the P-well regions 14. The substrate is then appropriately annealed to achieve the desired dopant profiles, to activate the dopant, and to remove the implant damage caused by ion implantation. Typically, the N-wells are between about 2.2 and 2.7 micrometers deep, and more specifically 2.5 micrometers deep. Typically the P-wells are between about 2.7 and 3.3 micrometers deep, and more specifically 3.0 micrometers deep. The N-wells are doped to a concentration of between about 3.6 E 16 and 4.4 E 16 atoms/cm$^3$, and more specifically to a concentration of 4.0 E 16 atoms/cm$^3$. The P-wells are doped to a concentration of between about 4.5 E 15 and 5.5 E 15 atoms/cm$^3$, and more specifically to a concentration of 5.0 E 15 atoms/cm$^3$.

The individual device areas over the P-wells 14 and over the N-wells 16 are surrounded and electrically isolated by a relatively thick Field OXide (FOX) 12. For example, the FOX can be formed by conventional means, such as the LOCal Oxidation of Silicon (LOCOS), in which a thin silicon oxide (pad oxide) layer and a thicker silicon nitride ($Si_3N_4$) layer are used as a barrier layer to oxidation. The pad oxide and $Si_3N_4$ layers are not depicted in FIG. 2 to simplify the drawing and the discussion. Conventional photolithographic techniques and etching are then used to remove the barrier layer over the regions where the FOX is desired, while retaining the $Si_3N_4$ over areas where the active devices are to be fabricated. The substrate 10 is then oxidized to form the FOX 12. Typically, the FOX is grown to a thickness of between about 4500 and 5500 Angstroms.

After removing the $Si_3N_4$ barrier layer and the pad oxide on the active device regions, the P- and N-channel FET devices are formed by first thermally oxidizing the active device regions to form a thin gate oxide 18. The preferred thickness of the gate oxide is between about 125 and 175 Angstroms, and is typically grown by dry oxidation in an oxygen ambient.

Still referring to FIG. 2, an undoped polysilicon layer 20 is deposited on the substrate 10, and is preferably deposited to a thickness of between about 3500 and 4400 Angstroms. Polysilicon layer 20 is doped $P^+$ over the N-wells 16, while the polysilicon layer 20 over the P-wells 14 is masked with a photoresist block-out mask to prevent implanting $P^+$ dopant in that portion of layer 20 over the P-wells. After stripping the photoresist block-out mask, the polysilicon layer 20 over the P-wells is doped with an $N^+$ dopant, while masking the polysilicon layer 20 over the N-wells with a photoresist block-out mask. To simplify the discussion and the Fig., the ion implanting of polysilicon layer 20 and photoresist masking steps are not explicitly shown in FIG. 2. Preferably, the $N^+$ dopant is carried out by implanting arsenic ($As^{75}$) ions having a concentration of between about 1.0 E 19 and 1.0 E 21 ions/$cm^3$, and preferably the $P^+$ dopant is performed by implanting boron ($B^{11}$) providing a concentration of between about 1.0 E 19 and 1.0 E 21 ions/$cm^3$.

Using conventional photolithographic techniques and anisotropic plasma etching, the doped polysilicon layer 20 is patterned, as shown in FIG. 2, to form gate electrodes 20 for the N-channel and the P-channel FETs. Preferably the polysilicon can be etched using reactive ion etching (RIE) or a high plasma density and using an etchant gas having a high selectivity of polysilicon to oxide, such as a gas containing chlorine (Cl) species. The polysilicon layer 20 patterned over the FOX regions 12 can also serve to provide local interconnections, such as on static random access memory (SRAM) circuits, logic circuits, and the like.

$N^-$ lightly doped source/drain (LDD) regions 22 are formed next in the device areas adjacent to the N-channel FET gate electrodes 20($N^+$), while using a photoresist block-out mask (not shown) to mask areas over the P-channel FET regions where the $N^-$ implants are not desired. The $P^-$LDDs regions 24 are similarly formed in the N-well regions for the P-channel FETs. The $N^-$LDDs are usually formed by implanting an N-type dopant species such as arsenic ($As^{75}$) or phosphorus ($p^{31}$). For example, a typical implant might consist of $p^{31}$ at a dose of between about 1.0 E 13 and 1.0 E 14 ions/$cm^2$, and an energy of between about 30 and 80 KeV. The $P^-$LDDs are preferably formed by implanting a P-type dopant species, such as $BF_2$. For example, a typical implant dose might consist of $BF_2$ at a dose of between about 1.0 E 13 and 1.2 E 13 atoms/$cm^2$, and at an implant energy of between about 40 and 60 KeV.

After completing the LDDs, sidewall spacers 26 are formed next on the sidewalls of the gate electrodes 20. A conformal first insulating layer is deposited, and is anisotropically etched back to the silicon substrate 10 to form the sidewall spacers 26. For example, a first insulating layer can be a silicon oxide ($SiO_2$) deposited by chemical vapor deposition (CVD) using tetraethosiloxane (TEOS) at a temperature in the range of about 650° to 900° C. The etch back is performed in a reactive ion etcher at low pressure.

Referring now to FIG. 3, the source/drain regions are formed next. The Fig. depicts the process after the $N^+$ source/drain areas 28($N^+$) in the P-wells 14 are formed. These $N^+$ source/drain regions are formed by providing a photoresist mask (not shown) over the N-well areas 16 and implanting, for example, arsenic ($As^{75}$) in the device areas adjacent to the sidewall spacers 26 in the P-well areas 14. For example, the $As^{75}$ can be implanted at a dose of 2.0 E 15 and 70 KeV. Now, after removing the photoresist over the N-well regions 16, and more specifically relating to the method of this invention, another photoresist mask 30 (as shown in FIG. 3) is used as a block-out mask over the P-well regions 14 during the implanting of the $P^+$ source/drain regions 32($P^+$) in the N-wells. More specifically, the implant of the $P^+$ source/drain regions in the N-wells is carried out using an ion source of boron difluoride ($BF_2$) as depicted by the arrows 34 in FIG. 3. Important to this invention, the photoresist mask layer 30 is redesigned or modified to also leave portions aligned over the P-channel FET gate electrode 20($P^+$). This prevents the $BF_2$ from being implanted into the gate electrode 20($P^+$) when the $P^+$ source/drain contact regions 32($P^+$) are implanted. This allows one to use $BF_2$ implanted doses that exceed 1.0 E 16 ions/$cm^2$ which would otherwise result in outgassing of the fluorine at subsequent high-temperature thermal processing, which would cause delamination between the gate electrode and the insulating layer that is later deposited on the substrate. Preferably the $BF_2$ implant dose is between about 2.5 E 15 and 3.5 E 15 ions/$cm^2$, and more specifically an implant dose of 3.0 E 15 ions/$cm^2$. The implant energy is between about 40 and 70 KeV.

In addition, by eliminating the $BF_2$ implant in the gate electrode, the enhanced diffusion of the boron through the P-channel gate electrode is avoided, thereby providing a more stable and repeatable threshold voltage. This eliminates the need for using elemental boron ($B^{11}$) as the implant species, which would otherwise give a much deeper source/drain junction, as described by S. Wolf in the previously cited reference, Silicon Processing for the VLSI Era, Vol. 2, pp. 398.

Referring to FIG. 4, after removing the photoresist block-out mask 30, an interlevel dielectric layer composed of a second insulating layer 36 and a third insulating layer 38 are then deposited to provide the electrical insulation between the FETs and the next level of metal wiring. Preferably, layer 36 is composed of silicon nitride ($Si_3N_4$) and is deposited by low pressure chemical vapor deposition (LPCVD) using a reactant gas such as dichlorosilane ($SiCl_2H_2$) and ammonia ($NH_3$) at a temperature of between about 750° and 850° C. Layer 36 protects the FETs from ionic contamination, such as sodium ions. Layer 36 also provides a diffusion barrier to prevent the boron dopant in the third insulating layer 38, which is composed of borophosphosilicate glass (BPSG), from diffusing into the N-channel FET source/drain areas 28($N^+$). A third insulating layer 38 composed of a low-flow-temperature glass is then deposited on layer 36, and is annealed to locally planarize the surface. The material of choice is a borophospho-silicate glass (BPSG), and the preferred thickness is between about 6000 and 7500 Angstroms. BPSG layer 38 can be deposited using, for example, plasma enhanced chemical vapor deposition (PECVD) using, for example, silane ($SiH_4$) and oxygen ($O_2$) doped with phosphine ($PH_3$) and a boron dopant such as diborane hydride ($B_2H_6$). Alternatively, the BPSG can be deposited using TEOS and by adding appropriate dopants such as boron and phosphorus to enhance the subsequent flow planarization. For example, the BPSG can be planarized by reflowing in nitrogen ($N_2$) at a temperature of between about 900° and 950° C. for about 30 to 40 minutes.

This completes the fabrication of the N- and P-channel FETs for building a CMOS structure in which the P-channel FETs are free of voids or delamination between the patterned $P^+$ doped polysilicon layer 20 and the ILD layer (layers 36 and 38).

While the invention has been particularly shown and described with reference to the preferred embodiments thereof, it will be understood by those skilled in the art that various changes in form and details may be made without departing from the spirit and scope of the invention.

What is claimed is:

1. A method for fabricating P-channel and N-channel field effect transistors (FETs) with improved P-channel FETs comprising the steps of:

providing a semiconductor substrate having device areas surrounded and electrically isolated by field oxide regions, said device areas having N-wells for P-channel FETs and P-wells for N-channel FETs;

forming a gate oxide on said N- and P-wells;

depositing a polysilicon layer on said substrate and doping said polysilicon over said P-wells with an N-type dopant and doping said polysilicon over said N-wells with a P-type dopant;

patterning said polysilicon layer and thereby forming gate electrodes for said N-channel and said P-channel FETs;

masking said N-wells with a photoresist mask and implanting lightly doped N⁻ source/drain regions in said P-wells adjacent to said gate electrodes;

masking said P-wells with a photoresist mask and implanting lightly doped P⁻ source/drain regions in said N-wells adjacent to said gate electrodes;

depositing a conformal first insulating layer over said gate electrodes and elsewhere over said substrate;

anisotropically etching back said first insulating layer and thereby forming sidewall spacers on said gate electrodes;

masking said N-wells with a photoresist mask and implanting N⁺ source/drain regions in said P-wells adjacent to said sidewall spacers;

masking said P-wells with a photoresist mask and concurrently forming said photoresist mask over said gate electrodes on said N-well regions;

implanting P⁺ source/drain regions in said N-wells adjacent to said sidewall spacers using boron difluoride (BF$_2$) ions, said photoresist mask over said gate electrodes preventing BF$_2^+$ ion implantation in said gate electrodes;

depositing a conformal second insulating layer over said gate electrodes and elsewhere on said substrate;

depositing a third insulating layer on said second insulating layer and planarizing said third insulating layer, said prior photoresist mask on said gate electrodes on said N-wells for said P-channel FET gate electrodes preventing void formation between said P-channel gate electrodes and said second insulating layer during subsequent high-temperature processing, and further eliminating enhanced diffusion of boron in said gate oxide on said N-well regions.

2. The method of claim 1, wherein said polysilicon layer is deposited to a thickness of between about 3500 and 4400 Angstroms.

3. The method of claim 1, wherein said lightly doped P⁻ source/drain regions are implanted with BF$_2$ ions.

4. The method of claim 3, wherein said BF$_2$ ions are implanted at an implant dose of between 1.0 E 13 and 1.2 E 13 ions/cm² and an energy of between about 40 and 60 KeV.

5. The method of claim 1, wherein said P⁺ source/drain contact regions are implanted with said BF$_2$ at an implant dose of between 2.5 E 15 and 3.5 E 15 ions/cm² and an energy of between about 40 and 70 KeV.

6. The method of claim 1, wherein said photoresist mask over said P-channel FET gate electrodes is sufficiently thick to prevent BF$_2^+$ ion implantation in said P-channel FET gate electrodes.

7. The method of claim 6, wherein said photoresist mask is at least greater than about 2.5 micrometers in thickness.

8. The method of claim 1, wherein said second insulating layer is silicon nitride (Si$_3$N$_4$) having a thickness of between about 300 and 500 Angstroms.

9. The method of claim 1, wherein said third insulating layer is a borophosphosilicate glass (BPSG) deposited to a thickness of between about 6000 and 7500 Angstroms.

10. The method of claim 8, wherein said BPSG is planarized by annealing in nitrogen (N$_2$) at a temperature of between about 900° and 950° C., for between about 30 and 40 minutes.

11. A method for fabricating CMOS circuits from P-channel and N-channel field effect transistors (FETs) with improved P-channel FETs comprising the steps of:

providing a semiconductor substrate having device areas surrounded and electrically isolated by field oxide regions, said device areas having N-wells for P-channel FETs and P-wells for N-channel FETs;

forming a gate oxide on said N- and P-wells;

depositing a polysilicon layer on said substrate and doping said polysilicon over said P-wells with an N-type dopant and doping said polysilicon over said N-wells with a P-type dopant;

patterning said polysilicon layer and thereby forming gate electrodes for said N-channel and said P-channel FETs;

masking said N-wells with a photoresist mask and implanting lightly doped N⁻ source/drain regions in said P-wells adjacent to said gate electrodes;

masking said P-wells with a photoresist mask and implanting lightly doped P⁻ source/drain regions in said N-wells adjacent to said gate electrodes;

depositing a conformal first insulating layer over said gate electrodes and elsewhere over said substrate;

anisotropically etching back said first insulating layer and thereby forming sidewall spacers on said gate electrodes;

masking said N-wells with a photoresist mask and implanting N⁺ source/drain regions in said P-wells adjacent to said sidewall spacers;

masking said P-wells with a photoresist mask and concurrently forming said photoresist mask over said gate electrodes on said N-well regions implanting P⁺ source/drain regions in said N-wells adjacent to said sidewall spacers using BF$_2^+$ ions, said photoresist mask over said gate electrodes preventing BF$_2^+$ ion implantation in said gate electrodes;

depositing a conformal second insulating layer composed of silicon nitride (Si$_3$N$_4$) over said gate electrodes and elsewhere on said substrate;

depositing a third insulating layer composed of borophosphosilicate glass (BPSG) on said second insulating layer and leveling by thermal anneal said third insulating layer, said prior photoresist mask on said P-channel FET gate electrodes on said N-wells preventing void formation between said P-channel gate electrodes and said second insulating layer during said thermal anneal and subsequent high-temperature processing, and further eliminating enhanced diffusion of boron in said gate oxide on said N-well regions; electrically interconnecting said N- and P-channel FETs and thereby forming said CMOS circuits.

12. The method of claim 11, wherein said polysilicon layer is deposited to a thickness of between about 3500 and 4400 Angstroms.

13. The method of claim 11, wherein said lightly doped P⁻ source/drain regions are implanted with BF$_2$ ions.

14. The method of claim 13, wherein said BF$_2$ ions are implanted at an implant dose of between 1.0 E 13 and 1.2 E 13 ions/cm² and an energy of between about 40 and 60 KeV.

15. The method of claim 11, wherein said P⁺ source/drain regions are implanted with said BF$_2$ at an implant dose of between 2.5 E 15 and 3.5 E 15 ions/cm² and an energy of between about 40 and 70 KeV.

16. The method of claim 11, wherein said photoresist mask over said P-channel FET gate electrodes is sufficiently thick to prevent $BF_2^+$ ion implantation in said P-channel FET gate electrodes.

17. The method of claim 16, wherein said photoresist mask is at least greater than about 2.5 micrometers in thickness.

18. The method of claim 11, wherein said second insulating layer has a thickness of between about 300 and 500 Angstroms.

19. The method of claim 11, wherein said third insulating layer is deposited to a thickness of between about 6000 and 7500 Angstroms.

20. The method of claim 11, wherein said BPSG is planarized by annealing in nitrogen ($N_2$) at a temperature of between about 900° and 950° C., for between about 30 and 40 minutes.

* * * * *